United States Patent [19]

Ichikawa

[11] Patent Number: 4,691,356
[45] Date of Patent: Sep. 1, 1987

[54] AM/FM SYNCHRONIZING CIRCUIT

[75] Inventor: Toshihito Ichikawa, Saitama, Japan

[73] Assignee: Pioneer Electronic Corporation, Tokyo, Japan

[21] Appl. No.: 886,720

[22] Filed: Jul. 18, 1986

[30] Foreign Application Priority Data

Jul. 18, 1985 [JP] Japan .................. 60-110414[U]

[51] Int. Cl.⁴ .................................. H04N 5/00
[52] U.S. Cl. ............................ 381/4; 381/15; 455/142; 455/144
[58] Field of Search ............ 455/142, 143, 144; 381/2, 3, 4, 15; 329/1, 2

[56] References Cited

U.S. PATENT DOCUMENTS 4,435,618 3/1984 Fujishima .................. 455/144

Primary Examiner—Forester W. Isen
Attorney, Agent, or Firm—Sughrue, Mion, Zinn, Macpeak and Seas

[57] ABSTRACT

A synchronizing circuit used for both an AM intermediate frequency signal and an FM composite signal. A phase detector, voltage-controlled oscillator, frequency divider and phase shifter are connected in a phase-locked loop. The division factor of the frequency divider is controlled to different values for the AM and FM signals.

5 Claims, 5 Drawing Figures

AM/FM SYNCHRONIZING CIRCUIT

BACKGROUND OF THE INVENTION

The present invention relates to a PLL (Phase-Locked Loop) circuit which synchronizes with a carrier of an AM signal when the AM signal is received, and with a pilot signal of a stereo signal when an FM signal is received.

FIGS. 1 and 2 respectively illustrate schematic block diagrams of conventional PLL circuits receiving AM and FM signals. Both the AM and the FM circuits have a phase detector 1, a VCO (Voltage-Controlled Oscillator) 2 and a phase shifter 3 arranged in a phase-locked loop (PLL). In the conventional PLL circuit because of the differing frequencies, it is necessary to provide two separate synchronizing circuits shown in FIGS. 1 and 2 for receiving the AM signal and for receiving the FM signal, respectively.

In the PLL circuit shown in FIG. 1 for the AM signal, an intermediate frequency AM signal as a reference signal is applied to the phase detector 1. An output signal of the phase detector 1 is applied to the phase shifter 3 through the VCO 2. An output signal of the phase shifter 3 is fed back to the phase detector 1, is subjected to phase comparison with the input AM signal, and then controls the VCO 2. The phase shifter 3 also provides a synchronizing signal as an output. In such a circuit, the phase shifter 3 shifts the phase of the output signal from the VCO 2 by $\pi/2$ so as to obtain the synchronizing signal from the PLL circuit, since the output signal of the VCO 2 has a phase difference of $\pi/2$ with respect to the reference signal (AM input signal) when the phase detector 1 is an analog multiplier type. When the PLL circuit shown in FIG. 2 receives the FM signal, an FM composite signal is applied to the phase detector 1. A pilot synchronizing signal is generated through the VCO 2 and the phase shifter 3.

In the above-described conventional device provided in an AM/FM receiver, it is necessary to provide two separate PLL circuits for receiving the AM signal and also for receiving the FM signal. Thus, it causes the circuit to be complicated due to the large amount of the elements, and further, the cost may be high.

SUMMARY OF THE INVENTION

In view of the above drawbacks of the conventional synchronizing circuit, an object of the present invention is to provide an improved synchronizing circuit in which synchronizing signals both from the IF AM signal and from the FM composite signal are generated by the same PLL circuit.

The synchronizing circuit according to the present invention comprises a switching circuit which receives and alternatively selects an AM IF signal and an FM composite signal. A phase detector receives the output from the switching circuit as a reference signal. A VCO (Voltage-Controlled Oscillator) is controlled by the output of the phase detector. A frequency divider divides a frequency of an output of the VCO by one of two predetermined values. In such a circuit, the switching circuit and the frequency divider are both controlled by an AM/FM switching signal. In this manner of the present invention, an output signal of the PLL circuit can be synchronized with an IF carrier when an AM signal is received, and with a pilot signal when an FM signal is received.

DETAILED DESCRIPTION OF THE INVENTION

A preferred embodiment of the present invention will now be described in detail with reference to the accompanying drawings.

Figure 1:
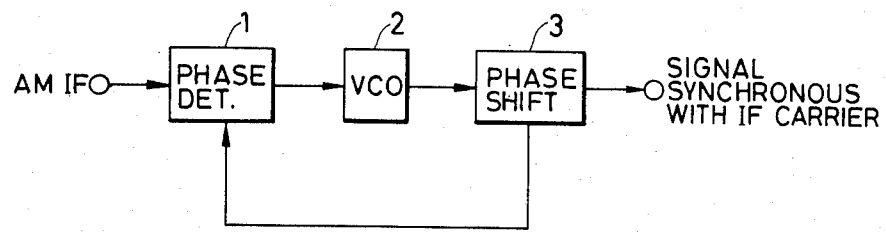
FIGS. 1 and 2 are block diagrams showing the conventional PLL circuits for the AM signal and for the FM signal, respectively.
Figure 2:
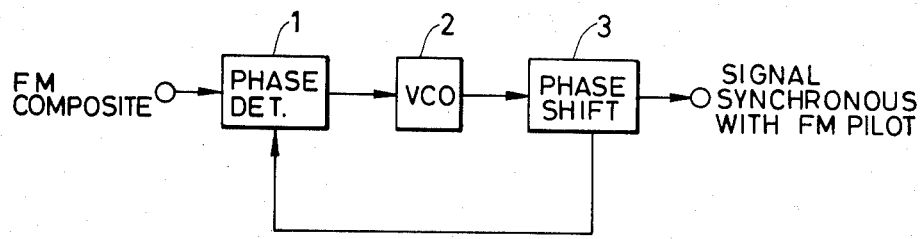
Figure 3:
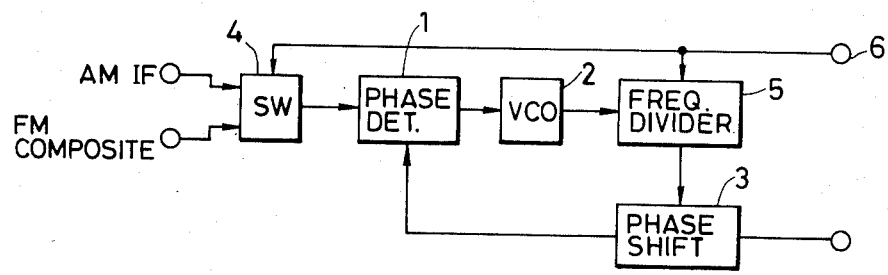
FIG. 3 is a block diagram showing a synchronizing circuit for the AM and the FM signals embodying the present invention.

FIG. 3 is a schematic block diagram showing a synchronizing circuit embodying the present invention. In FIG. 3, like parts and components are designated by the same reference numerals as that in FIGS. 1 and 2. A switching circuit 4 can alternatively select either an inputted AM signal or an FM signal. A frequency divider 5 receives the output of the VCO 2 and inputs the frequency divided signal to the phase shifter 3. A switching signal terminal transmits an AM/FM switching signal to the switching circuit 4 and to the frequency divider 5.

The frequency divider 5 is set to be actuated when the FM switching signal is transmitted from the switching signal terminal 6.

In ordinary operation, the frequency of the FM pilot signal is 19 kHz, and the frequency of the AM IF signal is 455 kHz. When the FM pilot signal is multiplied by 24, then its frequency becomes 456 kHz which is approximately equal to the frequency of the AM IF signal. The present invention is based on this fact. That is, in FIG. 3, when the FM signal is received, the switching signal terminal 6 transmits a signal to the switching circuit 4 so as to output the FM composite signal to the phase detector 1. The switching signal terminal also transmits a signal to the frequency divider 5 so as to actuate it. The FM signal inputted into the phase detector 1 is applied to the frequency divider 5 through the VCO 2. The signal is frequency divided by 24 by the frequency divider 5. The output of the frequency divider 5 is fed back to the phase detector 1 through phase shifter 3.

When the AM signal is received, the switching signal terminal 6 transmits a signal to the switching circuit 4 so as to output the AM IF signal, and also transmits a signal to the frequency divider 5 so as to short-circuit it. The AM signal inputted in the phase detector 1 is applied to the frequency divider through the VCO 2. The signal is not frequency divided by the frequency divider 5 because the divider is short-circuited. The output signal of the frequency divider 5 is fed back to the phase detector 1 through the phase shifter 3.

Figure 4:
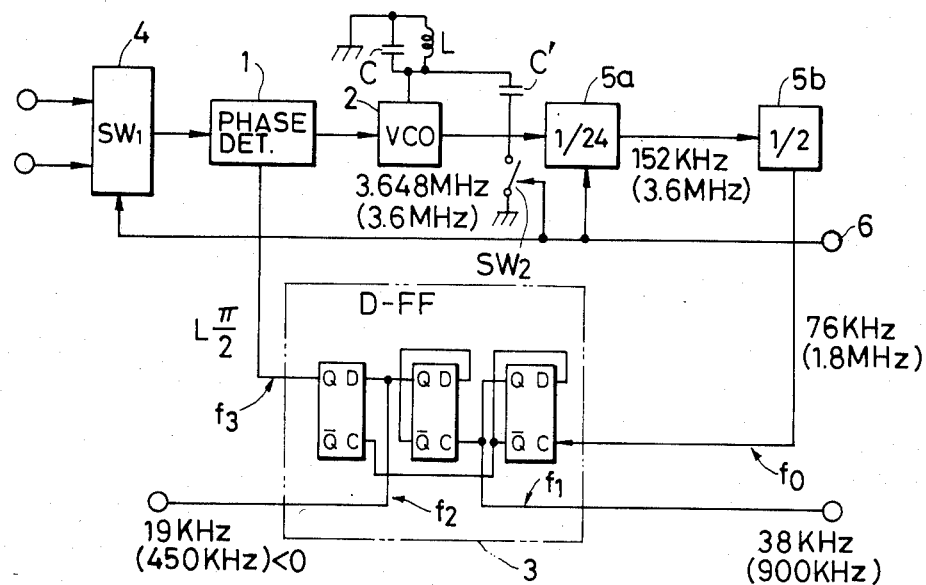
FIG. 4 is a circuit diagram showing a more concrete example in accordance with the construction of FIG. 3.

FIG. 4 is synchronizing circuit showing an embodiment of the above-described PLL circuit. In FIG. 4, if the frequency of the AM IF signal is set to be 450 kHz, for example, a free-running frequency $f_M$ of the VCO 2 at upon receiving the FM signal is $f_M = 1/(2\pi\sqrt{LC}) = 3.648$ MHz. The output of the VCO 2 is frequency divided by 48 by two frequency dividers 5a and 5b. Then the output of the frequency dividers 5a and 5b, having a frequency of 76 kHz, is applied to the phase shifter 3. The phase-shifter 3 consists of 3 D-type flip/flops with the clock inputs receiving signals to be frequency-divided or phase shifted. There are obtained from the phase shifter 3 a signal of 38 kHz for stereo sub-signal demodulation and a pilot signal of 19 kHz. The two frequency dividers 5a and 5b can use D-type flip-flops having the feed-back connections as in the first flip-flop in the phase-shifter 3. The frequency divider 5a can be bypassed by deselecting its flip-flops and switching on a parallel gate connected between the input and output.

Figure 5:
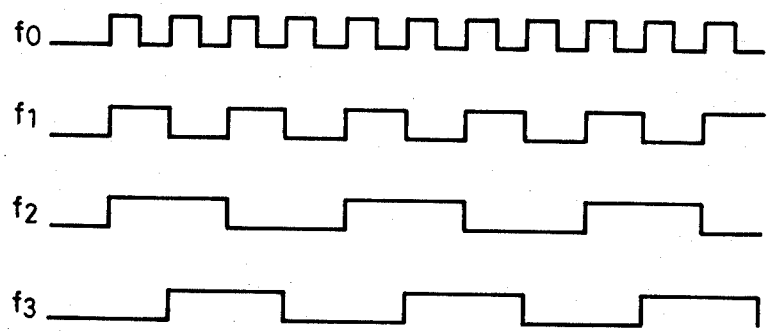
FIG. 5 illustrates a timing chart of the inputs and the outputs at the phase shifter shown in FIG. 4.

FIG. 5 shows a timing chart of the phase shifter 3 in FIG. 4. When the AM signal is received, a switch $SW_2$ shown in FIG. 4 is switched on and the free-running frequency $f_{EM}$ becomes $f_{EM}=1/(2\pi\sqrt{L(C+C')})=3.6$ MHz. The frequency divider 5a is short-circuited, so that the output of the VCO 2 is only divided by 2 by the frequency divider 5b. The 1.8 MHz output $f_0$ from the frequency divider 5b is applied to the phase shifter 3. Thus, similarly to the case during FM reception, a signal $f_1$ at 900 kHz and a signal $f_2$ at 450 kHz, both of which are synchronous with the AM IF carrier, are obtained.

In the description with reference to FIG. 5, there is a difference in frequency between the AM IF signal (455 kHz) and the FM pilot signal frequency multiplied by 24 (456 kHz). However, such a slight difference causes no problem since the difference is thoroughly within a lock range of the PLL circuit. Therefore, a synchronizing signal can be obtained by a common PLL circuit at both cases of the AM receiving and the FM receiving.

In the above embodiment, the oscillation frequency of the VCO is set to be approximately 3.6 MHz. However, other appropriate values of the oscillation frequency is applicable. Further, in the above embodiment, it is necessary to employ the phase shifter 3, since the phase detector 1 is analog multiplier type. In such a circuit employing the analog multiplier type comparator, the signal has to be shifted in phase by $\pi/2$ with respect to the reference signal so as to perform the lock operation of the PLL circuit. However, it is not necessary to provide the phase shifter 3 in case that the phase detector 1 is a digital comparator.

Furthermore, in the above described embodiment of the present invention, it is possible to obtain signals which synchronize with the IF signal with phase differences 0 and $\pi/2$ when the AM signal is received. Thus, stereo demodulation can be performed during AM reception by synchronously detecting the IF signal of the two signals.

As described in detail hereinabove, the present invention has the features and advantages as set below.

Because the AM and the FM signal is selectively applied to the phase detector from the switching means, and the frequency divider positioned at the previous portion of the phase shifter, is actuated only when the FM signal is received, a synchronizing circuit having a common PLL circuit for AM and FM signals can be obtained.

What is claimed is:

1. An AM/FM synchronizing circuit, comprising:
   switching means for alternatively selecting an AM intermediate frequency signal and an FM composite signal; and
   phase locking means for producing a signal synchronized with an intermediate frequency carrier of said AM intermediate frequency signal when said AM signal is selected and a signal synchronized with a pilot signal of said FM composite signal when said FM signal is selected, said phase locking means having an input coupled to an output of said switching means:
   said phase locking means comprising:
   phase comparing means for receiving an output of said switching means as a reference signal;
   voltage-controlled oscillating means controlled by an output of said phase detector;
   frequency dividing means for dividing a frequency of an output of said voltage-controlled oscillating means; and
   means for controlling a division factor of said frequency dividing means.

2. An AM/FM synchronizing circuit of claim 1, further comprising phase shifting means for shifting a phase of said output of said phase dividing means.

3. An AM/FM synchronizing as recited in claim 1, wherein said controlling means controls said division factor to a selected one of two values differing by a factor of 23.

4. An AM/FM synchronizing circuit of claim 1, wherein said controlling means controls said division factor of said frequency dividing means and the selecting of said switching means according to a single control signal.

5. An AM/FM synchronizing circuit as recited in claim 4, wherein said voltage-controlled oscillating means has a selectable free-running frequency and said controlling means controls said free-running frequency according to said single control signal.

* * * * *